United States Patent
Van Gastel

(10) Patent No.: US 6,189,875 B1
(45) Date of Patent: Feb. 20, 2001

(54) POSITIONING DEVICE WITH H-DRIVE HAVING SPRING COUPLING BETWEEN BEAMS

(75) Inventor: Josephus M. M. Van Gastel, Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/092,335

(22) Filed: Jun. 5, 1998

(30) Foreign Application Priority Data

Nov. 12, 1997 (EP) .................................................. 97203519

(51) Int. Cl.⁷ .................................................. G03B 41/00
(52) U.S. Cl. ............................................ 267/160; 267/165
(58) Field of Search ..................................... 267/160, 165

(56) References Cited

U.S. PATENT DOCUMENTS

| | | | | |
|---|---|---|---|---|
| 2,793,028 | * | 5/1957 | Wheeler | 267/160 |
| 2,932,482 | * | 4/1960 | Dickie | 267/160 |
| 2,947,067 | * | 8/1960 | Vice et al. | 207/160 |
| 2,966,049 | * | 12/1960 | Ormond | 267/160 |
| 4,183,627 | | 1/1980 | Camerik | 350/252 |
| 5,315,890 | * | 5/1994 | Long | 267/160 |

FOREIGN PATENT DOCUMENTS

| | | | | |
|---|---|---|---|---|
| 1120711 | * | 12/1961 | (DE) | 267/160 |
| 0109718 | | 5/1984 | (EP) | G03B/41/00 |

* cited by examiner

*Primary Examiner*—Matthew C. Graham
(74) *Attorney, Agent, or Firm*—Steven R. Biren

(57) ABSTRACT

The invention relates to a positioning device with an X-beam (6) and two parallel Y-beams (2,3) in the shape of an H. On each Y-beam a motor driven carriage (4,5) is provided. Between these carriages an X-beam is coupled. On the X-beam a carriage (9) with a positioning head (10) is provided. The coupling (7) between one end of the X-beam and the carriage (4) on the first Y-beam (2) comprises two leaf springs (19,20) perpendicular to each other, the intersecting line of said leaf springs forming an imaginary rotation axis (28) of the coupling. The coupling (8) between the other end of the X-beam and the carriage (5) on the other, second Y-beam (3) comprises one leaf spring (29) oriented in the Y-direction and having a relatively great stiffness in the Y-direction and a relative small stiffness in the X-direction. Advantage of these couplings: no play, frictionless, possibility of small angle correction for the positioning head.

4 Claims, 3 Drawing Sheets

POSITIONING DEVICE WITH H-DRIVE HAVING SPRING COUPLING BETWEEN BEAMS

BACKGROUND OF THE INVENTION

The invention relates to a positioning device comprising an X-beam on which a carriage provided with a positioning head is movable in an X-direction, a first Y-beam on which a first carriage is movable in a Y-direction, a second Y-beam on which a second carriage is movable in the Y-direction, while a first end of the X-beam is connected to the first carriage of the first Y-beam by means of a first coupling, and a second end of the X-beam is connected to the second carriage of the second Y-beam by means of a second coupling such that the X- and Y-beams are oriented in an H-arrangement, said device further comprising drive means for separately driving the carriages on the Y-beams and the carriage with the positioning head on the X-beam.

Such a positioning device is known from EP-B1-0 109 718. The couplings between the X-beam and the carriages on the Y-beams are formed therein by pivot shafts oriented in a Z-direction which connect the parts to one another with rotation possibility. To enable a rotation of the X-beam about the Z-axis, one end of the X-beam is constructed as a sliding coupling in the X-direction. A positioning device is used for accurately positioning the one part, which is supported by the positioning head of the carriage on the X-beam, with respect to another part, which is supported by a machine part which is usually stationary. This is, for example, a component which is to be placed on a printed circuit board. The ever continuing miniaturization of components leads to ever stricter requirements being imposed on the accuracy with which components are to be positioned with respect to one another.

SUMMARY OF THE INVENTION

It is an object of the invention to improve the accuracy of the device.

The positioning device is for this purpose characterized in that the first coupling is formed by two mutually perpendicular leaf springs which extend approximately in the X-direction and the Y-direction, respectively, one end of each leaf spring being fastened to the first end of the X-beam and the other end of each leaf spring being fastened to the first carriage of the first Y-beam, the line of intersection of said leaf springs forming an axis of rotation which extends in the Z-direction, the second coupling is formed by only one leaf spring which extends approximately in the Y-direction, one end of said leaf spring being fastened to the second end of the X-beam and the other end to the second carriage of the second Y-beam, said leaf spring having a comparatively high stiffness in the Y-direction and a comparatively low stiffness in the X-direction.

The first coupling is a kind of cross-spring hinge. The (imaginary) line of intersection of the two leaf springs forms a very accurate axis of rotation about which the X-beam can perform a rotation relative to the carriage on the first Y-beam. The stiffness in the X-direction is comparatively high and in the Y-direction comparatively low for the leaf spring of the first coupling which extends approximately in the X-direction, whereas this is exactly the opposite for the leaf spring which is perpendicular thereto. To render possible a rotation of the X-beam, which will usually relate to very small rotations, the leaf spring of the second coupling must have a comparatively low stiffness in the X-direction and a comparatively high stiffness in the Y-direction. The stiffness in the Z-direction is obviously also high for all leaf springs. The great advantage of the leaf spring couplings is that they are absolutely free from play and free from friction. The stiffness against rotation about the longitudinal axis of the X-beam is high because the leaf springs extend in the Y-direction. The construction of the X-beam in relation to the Y-beams is statically fully defined. The leaf spring of the second coupling also allows for a change in length of the X-beam in the X-direction caused by temperature changes.

Another great advantage is that the orientation around the Z-axis of a component to be positioned, such as a component on a printed circuit board, can be very accurately adjusted. It is possible to have the X-beam undergo a small angular rotation in that, for example, one of the carriages on the Y-beam is caused to continue a little farther or less far, whereby a fine angular correction of the component is achieved.

Preferably, the X-beam and the Y-beams lie substantially in one and the same plane. As a result, the center of gravity of the total moving construction (the X-beam plus the carriages plus the positioning head) lies approximately in the plane in which the driving forces are exerted. This also enhances the positioning accuracy.

BRIEF DESCRIPTION OF THE DRAWING

The invention will now be explained in more detail with reference to an embodiment of a machine for the placement of components on a carrier as shown in the drawing, in which.

DESCRIPTION OF THE PREFERRED EMBODIMENTS

Figure 1:
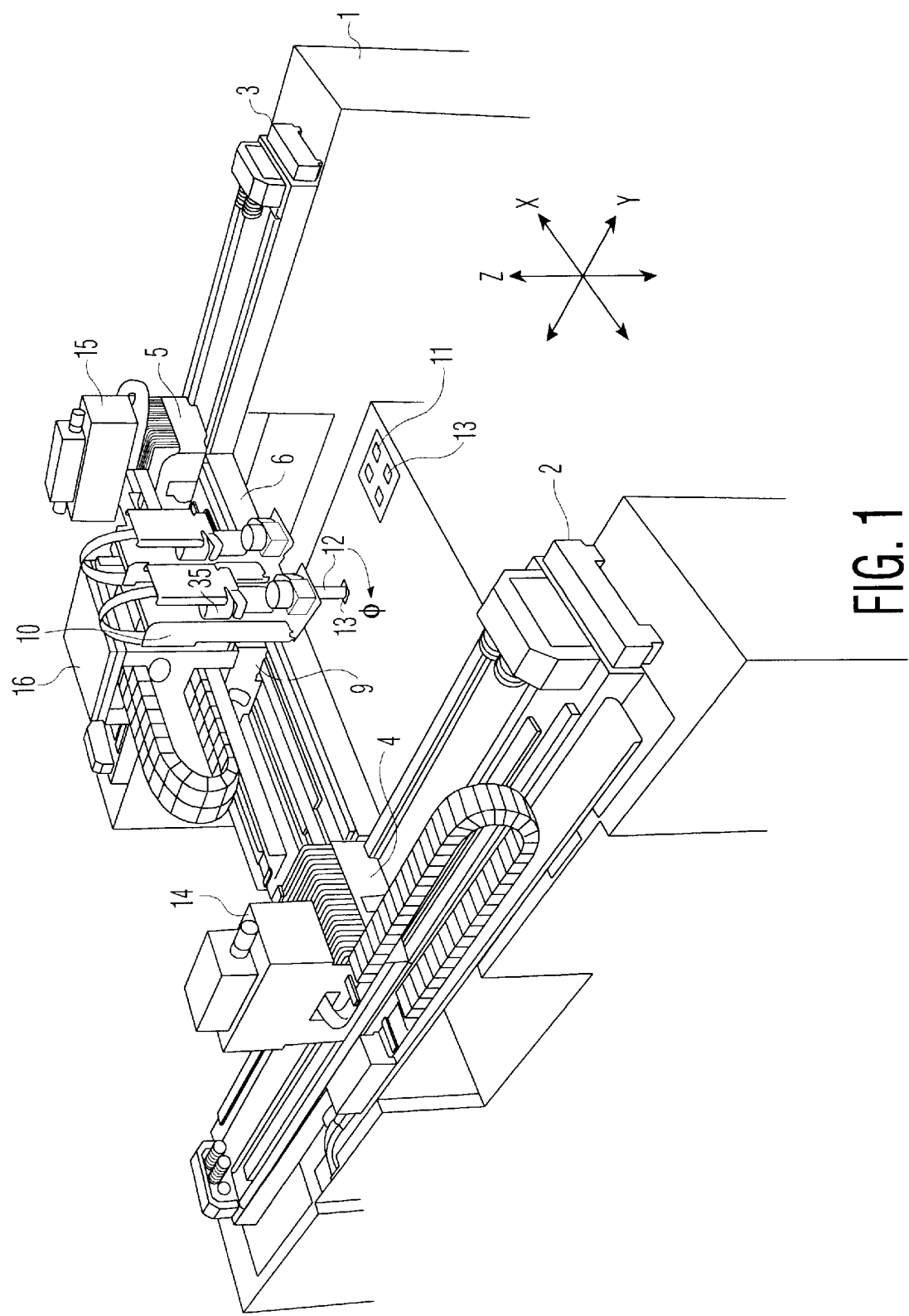
FIG. 1 perspective view of a positioning machine in which the invention is applied.
Figure 2:
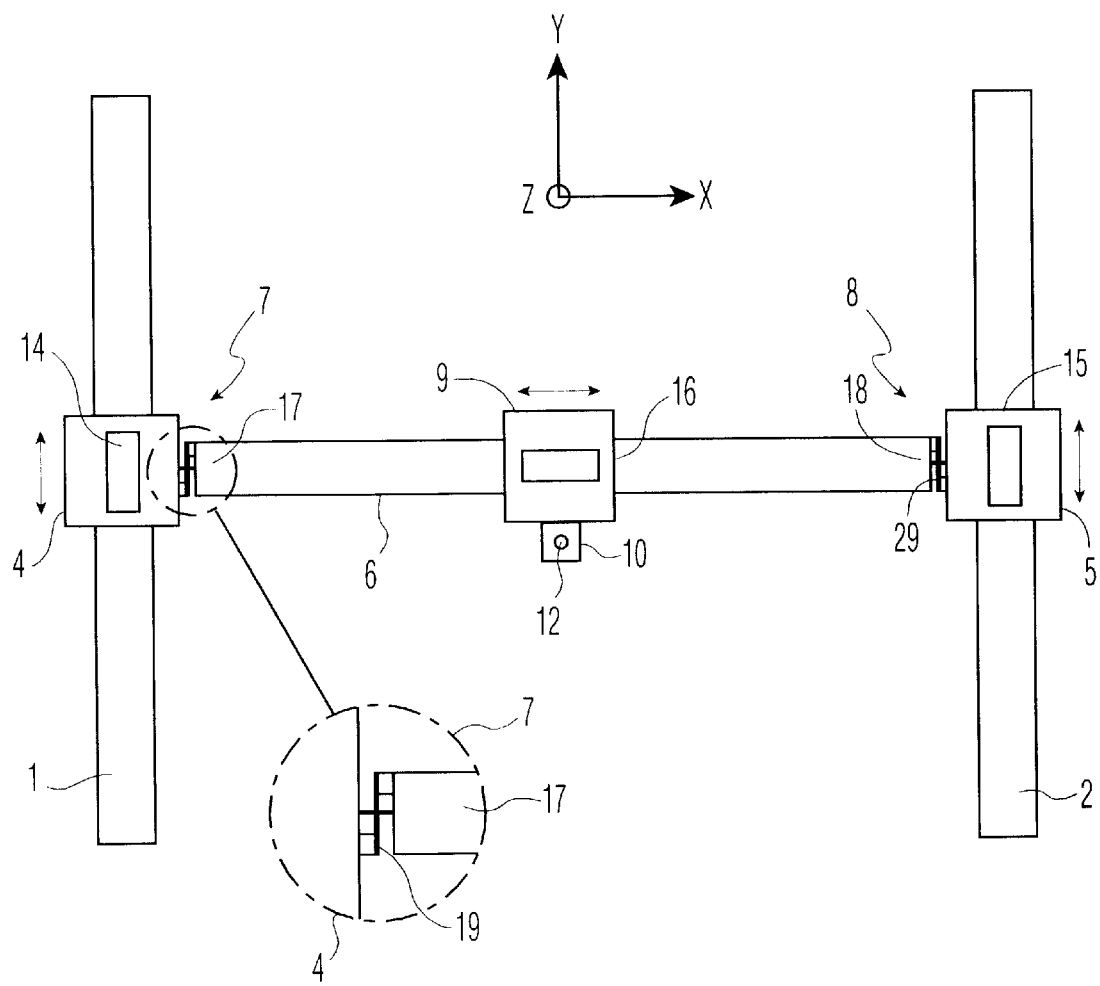
FIG. 2 is a diagrammatic plan view of a placement machine of FIG. 1.

The positioning machine shown in FIG. 1 is a placement machine for placing components on carriers such as printed circuit boards. Two parallel guide beams 2 and 3, referred to as first Y-beam 2 and second Y-beam 3 hereinafter, are fastened on the machine frame 1. A first carriage 4 and a second carriage 5 are provided on these respective Y-beams and are capable of moving along said beams. A transverse guide beam, called X-beam 6 hereinafter, is provided between the carriages 4 and 5. The X-beam forms an H-shape together with the first and the second Y-beam. The X-beam is connected to the carriages 4 and 5 by means of a first coupling 7 and a second coupling 8, respectively (see FIG. 2). A carriage 9 is provided on the X-beam 6 and is capable of moving along this X-beam. A placement head 10 is fastened on the carriage 9. Components can be picked up from a magazine by means of the placement head, moved into a desired position, and then placed on a printed circuit board 11. The printed circuit boards are transported through the placement machine by means of a transport mechanism which is not shown in any detail. It is also possible for several placement heads 10 to be fastened on the carriage 9. A placement head comprises, for example, a suction pipette 12 with which components 13, possibly very small components, can be picked up by suction. The placement head 10 can be displaced both in the X- and in the Y-direction. To achieve this, the carriages 4, 5, and 9 are each separately driven by respective motors 14, 15, and 16 along the first Y-beam 2, the second Y-beam 3, and the X-beam 5. This is why the device is referred to as a positioning device with H-drive. The placement head 10 may in addition be motor-driven in the Z-direction, while often the suction pipette is capable of performing a rotary movement Φ about its longitudinal axis, i.e. the Z-axis.

Figure 3:
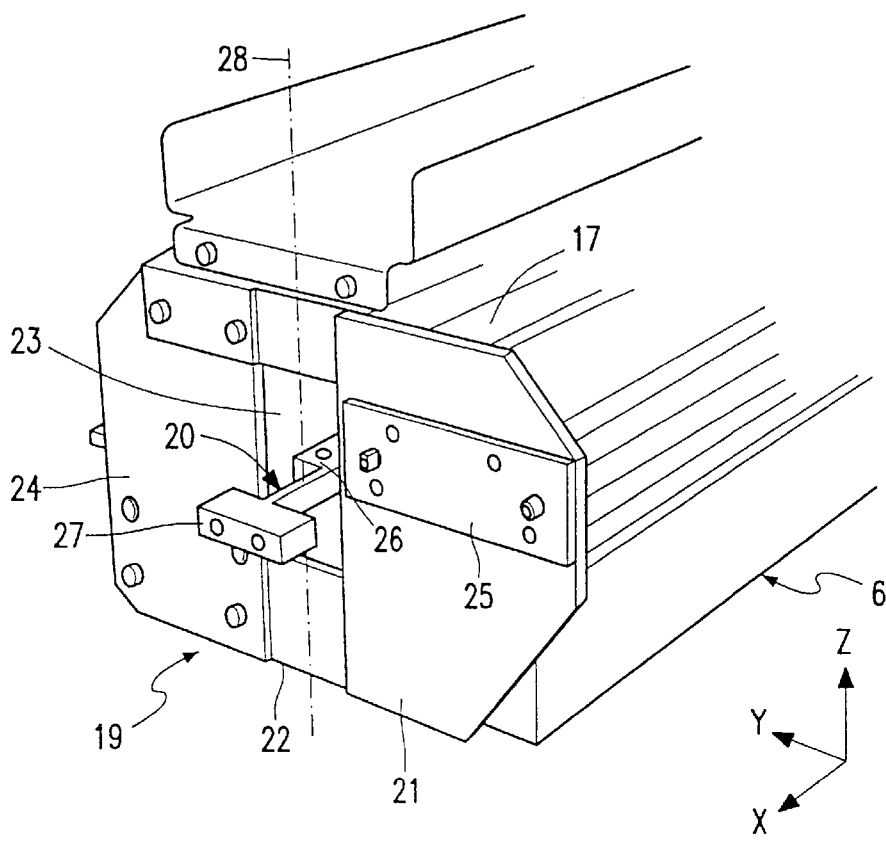
FIG. 3 shows a detail of the first coupling between the X-beam and the carriage on the first Y-beam and FIG. 4 is a detail of the second coupling between the X-beam and the carriage on the second Y-beam.
Figure 4:
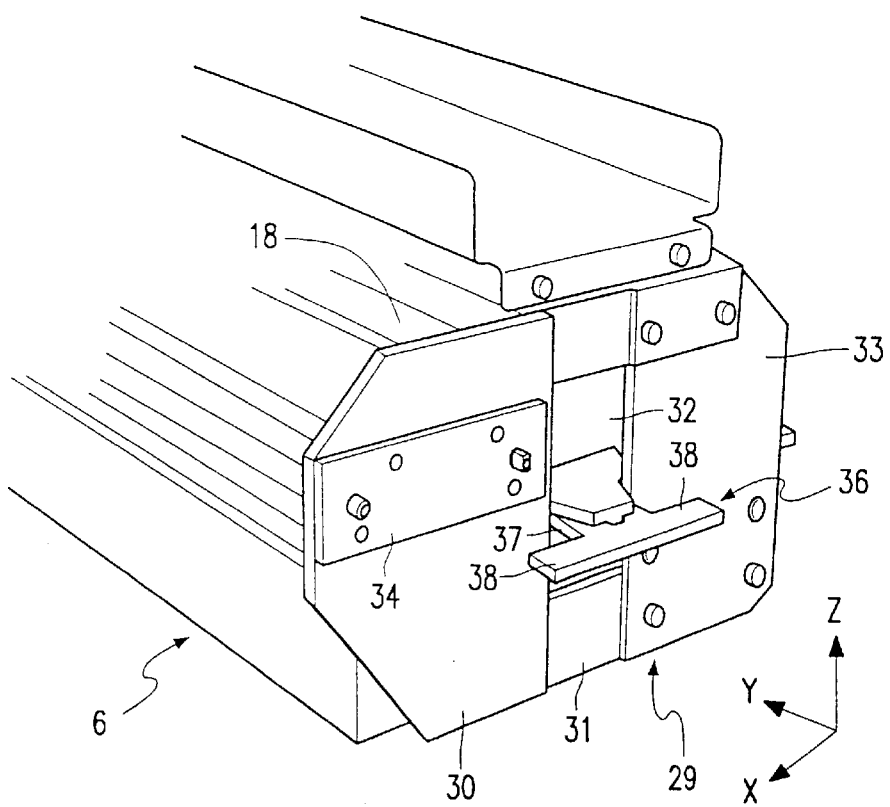

The movement of the X-beam in the Y-direction must be carried out very accurately and in a controlled manner. The movements of all carriages as well as the movements of the placement head and the suction pipette are controlled by a computer. A high accuracy can only be achieved if the couplings 7 and 8 between the ends 17 and 18 of the X-beam 6 and the carriages 4 and 5 also comply with high requirements. The first coupling 7 is for this purpose constructed as a cross-spring coupling which is formed by two mutually perpendicular leaf springs 19 and 20. The leaf spring 19 extends approximately in the Y-direction, and the leaf spring 20 extends in the X-direction. As FIG. 3 shows, the leaf spring 19 of the first coupling 7 comprises a stiff spring plate 21 with a thin central portion 22 which forms the actual leaf spring. The central portion has a recess 23 through which the other leaf spring 20 is passed. The ends 24 and 26 of the leaf springs 19 and 20, respectively, are fastened to the first end 17 of the X-beam 6, and the other ends 25 and 27 of the leaf springs are fastened to the first carriage 4 (the carriage 4 is not shown so as to keep the drawing clear). A coupling is thus created which is very stiff both in the X-direction and in the Y-direction, but which nevertheless allows of a small rotation about the Z-axis. The (imaginary) line of intersection of the two leaf springs in fact forms an axis of rotation 28 in the Z-direction. The X-beam 6 is accordingly capable of performing a small angular rotation about this axis of rotation 28 with respect to the first Y-beam. It is necessary for this, however, that the second coupling 8 should allow this. This second coupling is formed by one leaf spring 29 which extends approximately in the Y-direction. As is shown in FIG. 4, the leaf spring 29 also comprises a stiff spring plate 30 with a thin central portion 31 which forms the actual leaf spring. Here, again, the central portion has a recess 32. One end 33 of the leaf spring 29 is fastened to the second end 18 of the X-beam 6, and the other end 34 of the leaf spring is fastened to the second carriage 5 (the carriage 5 is not shown so as to keep the drawing clear). The leaf spring 29 has a comparatively high stiffness in the Y-direction and a comparatively low stiffness in the X-direction. When the second carriage 5 is driven a little farther in the Y-direction than is the first carriage 4, the X-beam will rotate about the axis of rotation 28 (see FIG. 2). This is a rotation through small angles, up to approximately 1°. The suction pipette can be rotated about the Z-axis by means of a motor 35 fastened on the placement head 10 for the purpose of positioning a component picked up by the suction pipette 12 in the desired location on a printed circuit board. The accuracy of this rotation, however, is limited. This may form a problem in the placement of very small components. The construction according to the invention now renders it possible to realize very small angular rotations of the suction pipette, and thus of the component, about the axis of rotation 28.

An angle limiter 36 is present adjacent the second coupling, preventing the X-beam 6 from rotating through an excessive angle, which could damage the leaf springs (see FIG. 4). The angle limiter is formed by a T-piece whose central leg 37 projects through the recess 32 of the leaf spring 29 and is fastened to the X-beam 6. The crossbars 38 of the T-piece prevent the X-beam from rotating too far. The crossbars will hit against the rigid portions of the spring plate 30 in the case of a too great angular rotation.

As is visible in FIG. 1, the X-beam and the two Y-beams lie approximately in one plane. The center of gravity of the X-beam with all carriages and the placement head accordingly lies approximately in the plane in which also the driving forces for driving the carriages are exerted.

What is claimed is:

1. A positioning device comprising an X-beam on which a carriage provided with a positioning head is movable in an X-direction, a first Y-beam on which a first carriage is movable in a Y-direction, a second Y-beam on which a second carriage is movable in the Y-direction, while a first end of the X-beam is connected to the first carriage of the first Y-beam by means of a first coupling, and a second end of the X-beam is connected to the second carriage of the second Y-beam by means of a second coupling such that the X- and Y-beams are oriented in an H-arrangement, said device further comprising drive means for separately driving the carriages on the Y-beams and the carriage with the positioning head on the X-beam, characterized in that the first coupling is formed by two mutually perpendicular leaf springs which extend substantially in the X-direction and the Y-direction, respectively, one end of each leaf spring being fastened to the first end of the X-beam and the other end of each leaf spring being fastened to the first carriage of the first Y-beam, the line of intersection of said leaf springs forming an axis of rotation which extends in the Z-direction, the second coupling is formed by only one leaf spring which extends substantially in the Y-direction, one end of said leaf spring being fastened to the second end of the X-beam and the other end to the second carriage of the second Y-beam, said leaf spring having a comparatively high stiffness in the Y-direction and a comparatively low stiffness in the X-direction.

2. A positioning device as claimed in claim 1, characterized in that the leaf spring of the first coupling which extends approximately in the Y-direction has a recess through which the leaf spring which extends approximately in the X-direction is passed.

3. A positioning device as claimed in claim 1, characterized in that the X-beam and the Y-beams lie substantially in one and the same plane.

4. A positioning device as claimed in claim 1, characterized in that the second coupling is provided with an angle limiter.

* * * * *